(12) United States Patent
Keller et al.

(10) Patent No.: US 7,256,393 B2
(45) Date of Patent: Aug. 14, 2007

(54) NON-LINEAR SIGNAL AMPLIFIERS AND USES THEREOF IN A MASS SPECTROMETER DEVICE

(75) Inventors: Craig A. Keller, Menlo Park, CA (US); Steve Waltman, Boulder, CO (US); Steve Miller, Palo Alto, CA (US); Michael G. Youngquist, Palo Alto, CA (US)

(73) Assignee: Bio-Rad Laboratories, Inc., Hercules, CA (US)

( * ) Notice: Subject to any disclaimer, the term of this patent is extended or adjusted under 35 U.S.C. 154(b) by 47 days.

(21) Appl. No.: 11/173,236

(22) Filed: Jun. 30, 2005

(65) Prior Publication Data

US 2006/0000982 A1  Jan. 5, 2006

Related U.S. Application Data

(60) Provisional application No. 60/686,680, filed on Jun. 1, 2005, provisional application No. 60/588,641, filed on Jul. 15, 2004, provisional application No. 60/585,350, filed on Jul. 1, 2004.

(51) Int. Cl.
*G01T 1/17* (2006.01)
*H01J 49/40* (2006.01)

(52) U.S. Cl. ............... 250/281; 250/282; 250/286; 250/287; 250/390.08

(58) Field of Classification Search ............ None
See application file for complete search history.

(56) References Cited

U.S. PATENT DOCUMENTS

| | | | |
|---|---|---|---|
| 2,463,544 A | 3/1949 | Langmuir | |
| 4,008,388 A | 2/1977 | McLafferty et al. | |
| 4,482,957 A | 11/1984 | Bjorkholm | |
| 5,291,017 A | 3/1994 | Wang et al. | |
| 6,353,324 B1 | 3/2002 | Uber, III et al. | |
| 6,841,936 B2 * | 1/2005 | Keller et al. | 313/533 |

OTHER PUBLICATIONS

Mark Shill, "Circuit takes square root of input voltage," EDN Access, Nov. 20, 1997, Burr-Brown Corp., Tucson, AZ.

* cited by examiner

*Primary Examiner*—Nikita Wells
(74) *Attorney, Agent, or Firm*—Townsend and Townsend and Crew LLP; Gerald T. Gray

(57) ABSTRACT

Signal amplifiers having a non-linear transfer function. A high speed (high bandwidth) circuit with a non-linear transfer function over a limited range of input signal is provided. By appropriate choice of components, the non-linear transfer function can be used to accurately approximate any monotonic function such as a square root transfer function. In another aspect, a piecewise non-linear circuit arrangement using a set of non-linear sub-circuits is provided to accurately generate a desired non-linear transfer function over an extended dynamic range of input signal. In one implementation of such a circuit, each of the sub-circuits approximates the desired non-linear function over a portion of the input range.

16 Claims, 10 Drawing Sheets

(E)

FIG. 11 Fast square root building block
(A) Basic non-linear element
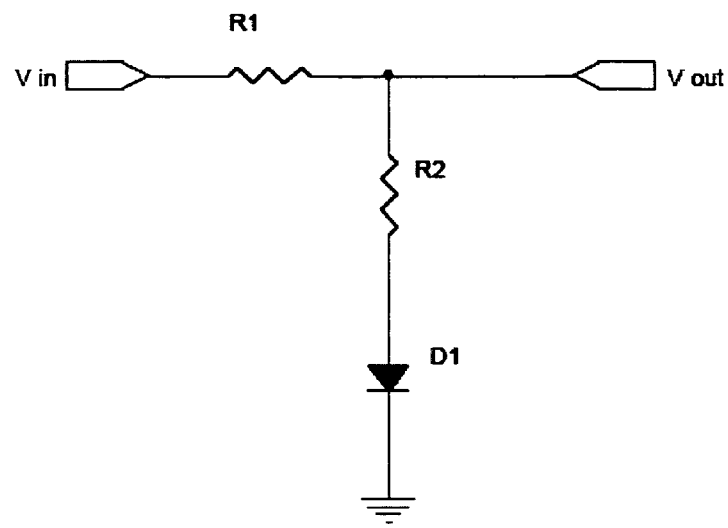
(B) Modified circuit
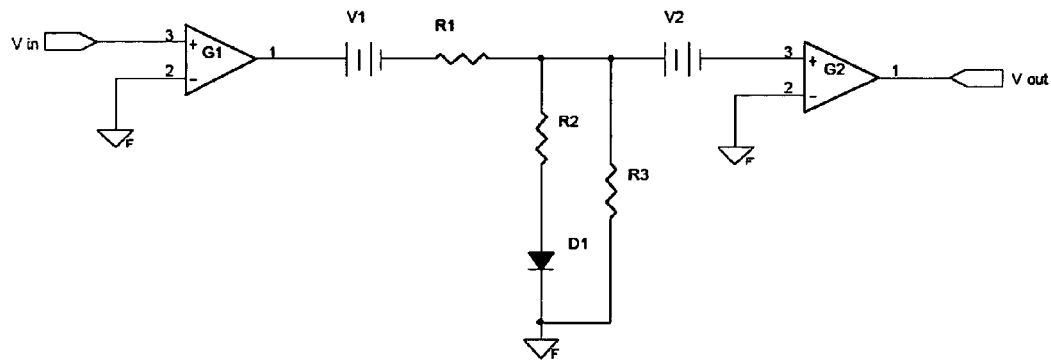
- R3 makes low signal response linear
- V1 and V2 offset the input and output signals
- G1 and G2 scale the input and output signals

NON-LINEAR SIGNAL AMPLIFIERS AND USES THEREOF IN A MASS SPECTROMETER DEVICE

CROSS-REFERENCES TO RELATED APPLICATIONS

This application claims the benefit of U.S. provisional application Nos. 60/585,350, filed Jul. 1, 2004, 60/588,641, filed Jul. 15, 2004, and 60/686,680, filed Jun. 1, 2005, each of which is hereby incorporated by reference in its entirety.

BACKGROUND OF THE INVENTION

The present invention relates generally to signal amplifiers, and in particular to signal amplifiers having a non-linear transfer function. The amplifiers of the present invention have a wide range of applicability, including, for example, in mass spectrometry devices or cameras.

In many signal processing applications, it is often desirable to digitize analog signals. For example, it is often desirable to convert analog signals representing detected physical events or phenomenon to digital signals for further processing in a digital computer system. To do so, analog signals are typically sampled at a certain rate and converted to digital bits using a digitizer, e.g., an analog-to-digital converter (ADC).

An ideal digitization system that is able to handle high dynamic range and high bandwidth signals is difficult to realize. Dynamic range refers to the ratio between the maximum signal level and the minimum signal level that can be handled by the electronic system. Often, the maximum level corresponds to the largest signal that can be handled without clipping or other substantial distortion, and the minimum signal level is determined by the larger of the noise level for small signals or the resolution of the digitizer for small signals. In electrical transmission systems, bandwidth refers to the range between the highest and lowest frequencies of a transmission channel. Bandwidth is typically measured in Hertz (Hz, cycles per second). For a signal sampled at discrete time intervals, the bandwidth of the signal is limited to one half the sampling rate (the Nyquist frequency).

A mass spectrometer is a good example of a system that requires a digitization system that can handle transient signals from the mass spectrometer that have a high dynamic range and large bandwidth. Ideally the dynamic range of a mass spectrometer designed for protein profiling will match the dynamic range of the concentration of proteins present in blood serum, or about $10^{15}$. This dynamic range is many orders of magnitude beyond the capability of any currently available protein profiling system including those using mass spectrometry. The realizable dynamic range of protein profiling systems using mass spectrometry techniques is currently closer to $10^5$. Part of this dynamic range can be practically realized using signal averaging, but much of it must be accounted for directly with the digitization system.

In a time-of-flight mass spectrometer (TOF-MS) system, the time resolution of the digitization system is one of the factors that determines the mass resolution that can be realized by the system. Ideally the time resolution of the mass spectrometer is limited by the detection system or the performance of the mass analyzer rather than the digitization system. Currently available ion detectors produce output signals with pulse widths ranging from tenths of nanoseconds to a few nanoseconds. Effectively digitizing these signals without loss of time resolution requires digitization systems with bandwidths from about 100 to about 5000 MHz.

Consider a digitization system with a dynamic range of approximately 7000 and a bandwidth of approximately 320 MHz. Using standard techniques such a system would require a 13-bit linear analog-to-digital converter (ADC) with a bandwidth greater than 320 MHz. Currently it is difficult and expensive to produce systems with such high combined dynamic range and bandwidth. However, the situation can be improved by considering the noise characteristics of the signal being processed. In general, all analog signals have noise.

A typical ADC is a substantially linear device that simply outputs a number proportional to the input at a fixed sampling rate. The dynamic range is usually determined by the largest number that the ADC can output. This dynamic range is usually $2^n$ where n is this number of digital bits used to represent the output number. Implicit in this calculation of the dynamic range is the assumption that the smallest signal that can be effectively measured is represented by a change of 1 in the output of the ADC. Thus, for a particular ADC there is a trade off between the largest signal measured and the amplitude resolution achieved. Choice of useful amplitude resolution is generally limited by noise; very little is gained by digitizing a signal with an amplitude resolution finer than the amplitude of the noise on the signal.

In general, the noise characteristic of a signal can vary with the amplitude of the signal. Further, the noise characteristic of a signal typically contains contributions from many different sources. In many electronic systems, for example, the amplitude of the noise is essentially independent of the amplitude of the signal (i.e., constant). This is usually true where the main noise contribution is, for example, thermal noise in amplifiers and other circuit components. Another type of noise, shot noise, arises when a signal is composed of discrete elements. For example, any electronic signal associated with a current has shot noise because the current is made up of discrete charge carriers, usually electrons. The amplitude of shot noise is proportional to the square root of the amplitude of the signal. Since most electronic signals involve extremely large numbers of electrons, the shot noise is often a very small fraction of the amplitude of these signals and is often a negligible portion of the total noise in the system. Shot noise also occurs when the signal is due to the detection of particles such as photons or charged or neutral particles. Thus, in a system such as a mass spectrometer, where the numbers of ions detected can be as low as a few or even single ions, shot noise can dominate all other noise sources.

The noise characteristic of the signal and the resolution of the digitization system can be matched by choosing the resolution of the digitizer to be roughly equivalent to the noise amplitude (Note that the peak-to-peak noise amplitude will usually be a few times the noise amplitude measured, for example, with a standard deviation). In this way, the largest possible signal is accommodated while the resolution of the system is limited by the noise in the signal and not by the resolution of the digitization (noise limited resolution). This is straight forward for a signal where the noise amplitude is constant. For a linear ADC, this procedure optimizes the dynamic range of the measurement system by minimizing the digitization levels devoted to measuring the noise in the signal and allowing the signal amplitude to be as large as possible. However, for a signal where the noise amplitude changes with signal amplitude, the situation is not so simple. With a linear ADC, matching the resolution to the amplitude of the noise at one signal amplitude will either cause the digitizer to become the resolution limiting factor at signal amplitudes where the noise is smaller or digitizer resolution will be wasted at signal amplitudes where the noise is larger.

This situation can be improved by constructing a digitization system where the resolution changes with signal amplitude such that the resolution is always matched to the amplitude of the noise. One way of doing this is to transform the signal before it is digitized with a linear ADC such that the noise amplitude of the transformed signal is a constant, i.e., the noise amplitude does not vary with the amplitude of the signal. For example, for a signal where the noise amplitude characteristic is dominated by shot noise (noise amplitude increases with the square root of the signal amplitude), the required transformation is to take the square root of the signal before digitizing with a linear ADC. Linear and logarithmic transformations are not optimal when the noise characteristic of the signal is dominated by shot noise. For example, with a linear transformation of the input signal before digitization with a linear ADC, the noise amplitude of the transformed signal will increase with larger signal amplitude exactly as it did in the untransformed signal. If the resolution is matched to the noise amplitude at low signal levels where the noise amplitude is smallest, then resolution will be wasted on high amplitude signals where the noise amplitude is larger. With a logarithmic transformation of the input signal before digitization with a linear ADC, the noise amplitude of the transformed signal will decrease with larger signal amplitude. If the resolution is matched to the noise amplitude at high signal levels where the noise amplitude is smallest, then resolution will be wasted on low amplitude signals where the noise amplitude is larger.

However, it is difficult to design amplifiers with particular non-linear transforms, such as a square root transform, and particularly difficult to design such amplifiers to handle high bandwidth signals, for example, signals with bandwidths greater than 100 MHz.

It is therefore desirable to provide an amplifier circuit that provides a non-linear transfer function, and particularly a square root transfer function. Such an amplifier circuit should also operate with a high dynamic range and a large bandwidth. It is also desirable to use such an amplifier in a mass spectrometer device or in a camera.

BRIEF SUMMARY OF THE INVENTION

The present invention provides signal amplifiers having a non-linear transfer function. In one aspect, a high speed (high bandwidth) circuit with a non-linear transfer function over a limited range of input signal is provided. By appropriate choice of components, the non-linear transfer function can be used to accurately approximate any monotonic function such as a square root transfer function. In another aspect, a piecewise non-linear circuit arrangement using a set of one or more non-linear sub-circuits is provided to accurately generate a desired non-linear transfer function over an extended range of input signal where each of the sub-circuits approximates the desired non-linear function over a portion of the input range. As used herein, a signal amplifier has a "substantially non-linear transfer function" if the desired output signal is a non-linear transform of the input signal. For example, the desired output can be a power, such as a square root or a square, a log, exponential (e.g., $e^x$) or other non-linear function of the input signal over the desired range. It is recognized that amplifiers designed to produce an output signal that is a linear transform of an input signal will produce an output having a small degree of non-linearity in their transfer function. However, this non-linearity in linear circuits is often undesirable and unintended, and is not considered to be substantially non-linear as used herein.

According to an aspect of the present invention, a circuit block that implements a non-linear transfer function is provided. The block typically includes a diode in series with an impedance element. An example of such a circuit block is shown in FIG. 1C. This circuit generates a non-linearity that can be shaped to match the desired transfer function using current biasing to modify the shape of the transfer function produced. The portion of the transfer function generated by the circuit block that most closely matches the desired transfer function can be selected or used. This is done, in certain aspects, by mapping the input and output onto this portion of the transfer function using gain and offset adjustments (scaling and shifting).

According to another aspect of the present invention, a circuit arrangement that processes an input signal with a non-linear transfer function to produce an output signal typically includes a plurality of circuit blocks, each having a different transfer function, and each configured to receive the input signal and produce an output, wherein at least one of the circuits has a non-linear transfer function, and a combining circuit configured to combine the outputs of the plurality of circuit blocks so as to produce the output signal.

Circuit blocks as described herein, such as a block including a diode element in series with an impedance element, can produce a transfer function to map some range of inputs to some range of outputs approximating a desired mapping. Typically there is an inverse relationship between the accuracy of the mapping and the range over which the mapping meets the required accuracy. A piecewise non-linear architecture provides a way to get around this limitation by using a set of circuit blocks, each producing the desired transfer function with the desired accuracy over a portion of the desired range. The outputs of the circuit blocks are tied together to produce the desired transfer function with the desired accuracy over a larger range than can be produced by any individual block.

According to yet a further aspect of the present invention, a mass spectrometer device is provided. The device typically includes a particle source that provides particles, a detector that detects the particles and provides a signal having an amplitude proportional to a detected particle flux, a signal amplifier having a non-linear transfer function that produces an amplified signal having a noise component that is substantially independent of the signal amplitude, and an analog to digital converter (ADC) that converts the amplified signal to a digital output signal.

According to still a further aspect of the present invention, a method of amplifying a mass spectra signal in a mass spectrometer is provided. The method typically includes receiving at least a portion of a transient signal from a signal source, the transient signal having an amplitude proportional to a detected particle flux, and amplifying the transient signal in a non-linear amplifier having a non-linear transfer function that approximates a square root transfer function to produce an amplified signal having a noise component that is substantially independent of the signal amplitude.

According to still a further aspect of the present invention, circuit arrangement is provided that generates an output signal that is a non-linear function of an input signal over an input signal range, comprising a diode in series with an impedance element.

According to another aspect of the present invention, a circuit arrangement is provided that generates an output signal that approximates a desired non-linear function of an input signal over an input signal range. The arrangement typically includes two or more circuits, wherein each circuit is configured to receive the input signal and produce a circuit output, wherein at least one of said circuits has a non-linear transfer function over at least a portion of the input signal range. The arrangement also typically includes a combining circuit that combines the circuit outputs to generate the output signal.

According to yet another aspect of the present invention, a method is provided for generating an output signal that is substantially a desired non-linear function of an input signal over an input signal range. The method typically includes providing a circuit having a diode in series with an impedance element, and additional circuitry comprising one or more of a) input circuitry to transform the input signal into a current passing through the diode and impedance element; b) bias circuitry to provide a bias current through the diode and impedance element; c) first offset circuitry to provide an offset to the input signal; d) second offset circuitry to provide an offset to the output signal; and e) scaling circuitry to provide scaling to the input and/or output signals. The method also typically includes adjusting one or more of the input circuitry, bias circuitry, first offset circuitry, second offset circuitry and scaling circuitry so as to generate an output signal that approximates the desired non-linear function of the input signal over the input signal range.

According to yet another aspect of the present invention, a method is provided for generating an output signal that is substantially a desired non-linear function of an input signal over an input signal range. The method typically includes providing two or more circuits having a diode in series with an impedance element, and additional circuitry comprising one or more of: a) input circuitry to transform the input signal into a current passing through the diode and impedance element; b) bias circuitry to provide a bias current through the diode and impedance element; c) first offset circuitry to provide an offset to the input signal; d) second offset circuitry to provide an offset to the output signal; and e) scaling circuitry to provide scaling to the input and/or output signals. The method also typically includes, for each of said two or more circuits, adjusting one or more of the input circuitry, bias circuitry, first offset circuitry, second offset circuitry and scaling circuitry so as to generate an output signal that approximates the desired non-linear function of the input signal over a portion of the input signal range, and combining the output signals from the two or more circuits to form a composite output signal that approximates the desired non-linear transfer function of the input signal over the input signal range.

According to another aspect of the present invention, a camera is provided that typically includes a photon detector comprising a plurality of pixel elements, wherein each pixel element detects photons and provides a pixel signal having an amplitude proportional to a detected number of photons, a signal amplifier having a substantially non-linear transfer function that processes a pixel signal to produce an amplified signal having a noise component that is substantially independent of the signal amplitude, and an analog to digital converter (ADC) that converts the amplified signal to a digital output signal. In certain aspects, the pixels are read or detected at a rate greater than 200 kHz, greater than 1 MHz, greater than 10 MHz or greater than 100 MHz.

According to a further aspect of the present invention, a circuit arrangement is provided that generates an output signal that approximates a desired non-linear function of an input signal over an input signal range. The arrangement typically include a first circuit element configured to produce a first non-linear transform that approximates the desired non-linear transform over a first part of the input signal range, and a second circuit element configured to produce a second non-linear transform that approximates the desired non-linear transform over a second part of the input signal range. the arrangement also typically includes a third circuit element configured to produce a transfer function that cancels out the parts of the transfer functions of the first and second circuit elements that do not approximate the desired non-linear function, and a combining element configured to combine outputs of the first, second and third circuit elements to produce an output signal that approximates the desired non-linear function over the entire input signal range. In certain aspects, the first circuit element includes a first sub-circuit element that approximates the desired non-linear function over a particular signal range, a first scaling element that performs a scaling function on the input signal and delivers the scaled input signal to the first sub-circuit, wherein the scaling function is selected so that the first part of the input signal range is scaled to the particular signal range at which the first sub-circuit approximates the desired non-linear function, and a second scaling element that undoes the scaling of the first element. In certain aspects, the first circuit element includes a first sub-circuit element that approximates the desired non-linear function over a particular signal range, a first scaling element that performs a scaling function on the input signal and delivers the scaled input signal to the first sub-circuit, wherein the scaling function is selected so that the first part of the input signal range is scaled to the particular signal range at which the first sub-circuit approximates the desired non-linear function, and a second scaling element that performs a second scaling function on the output of the first sub-circuit. In certain aspects, the first part of the input signal range is 1 to X units, wherein the scaling function multiplies the input signal by a factor of X, and wherein the second scaling element multiplies the output of the first sub-circuit by a factor of $1/(\sqrt{X})$. In certain aspects, X is 84. In certain aspects, the second scaling function is selected to be fully inverse or partially inverse to the first scaling function.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

1B is the diode curve. The transfer function of a circuit of FIG. 1C is the hybrid curve laying between the other two.

Figure 2:
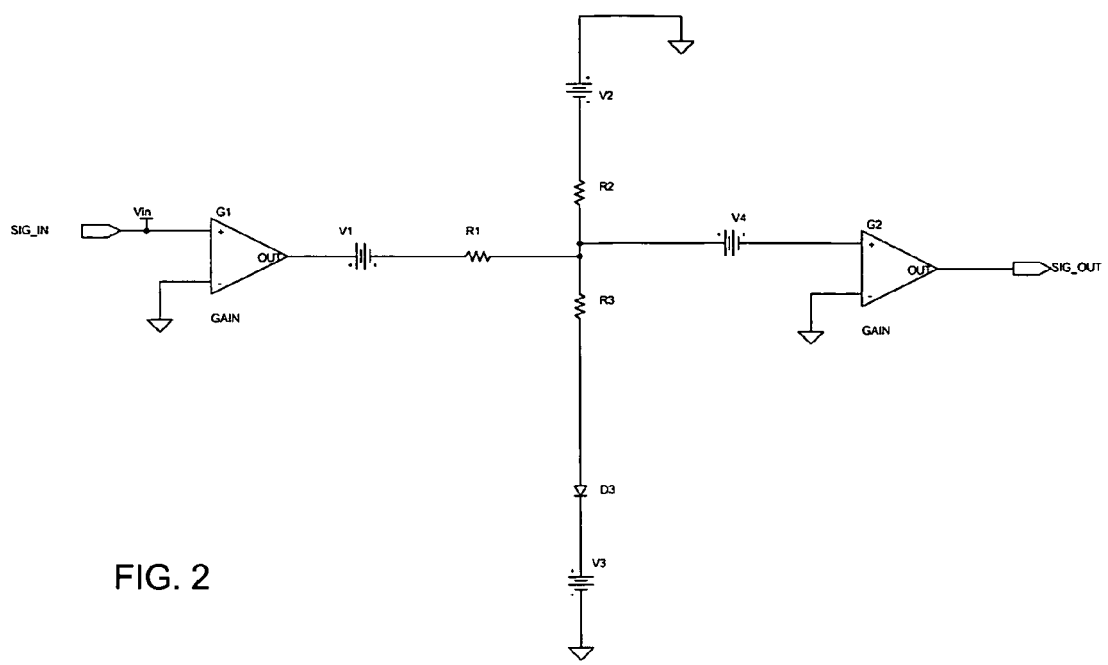

FIG. 2 shows a diode based non-linear circuit with components to allow gain, offset, bias current, and shaping adjustments according to one embodiment.

Figure 3:
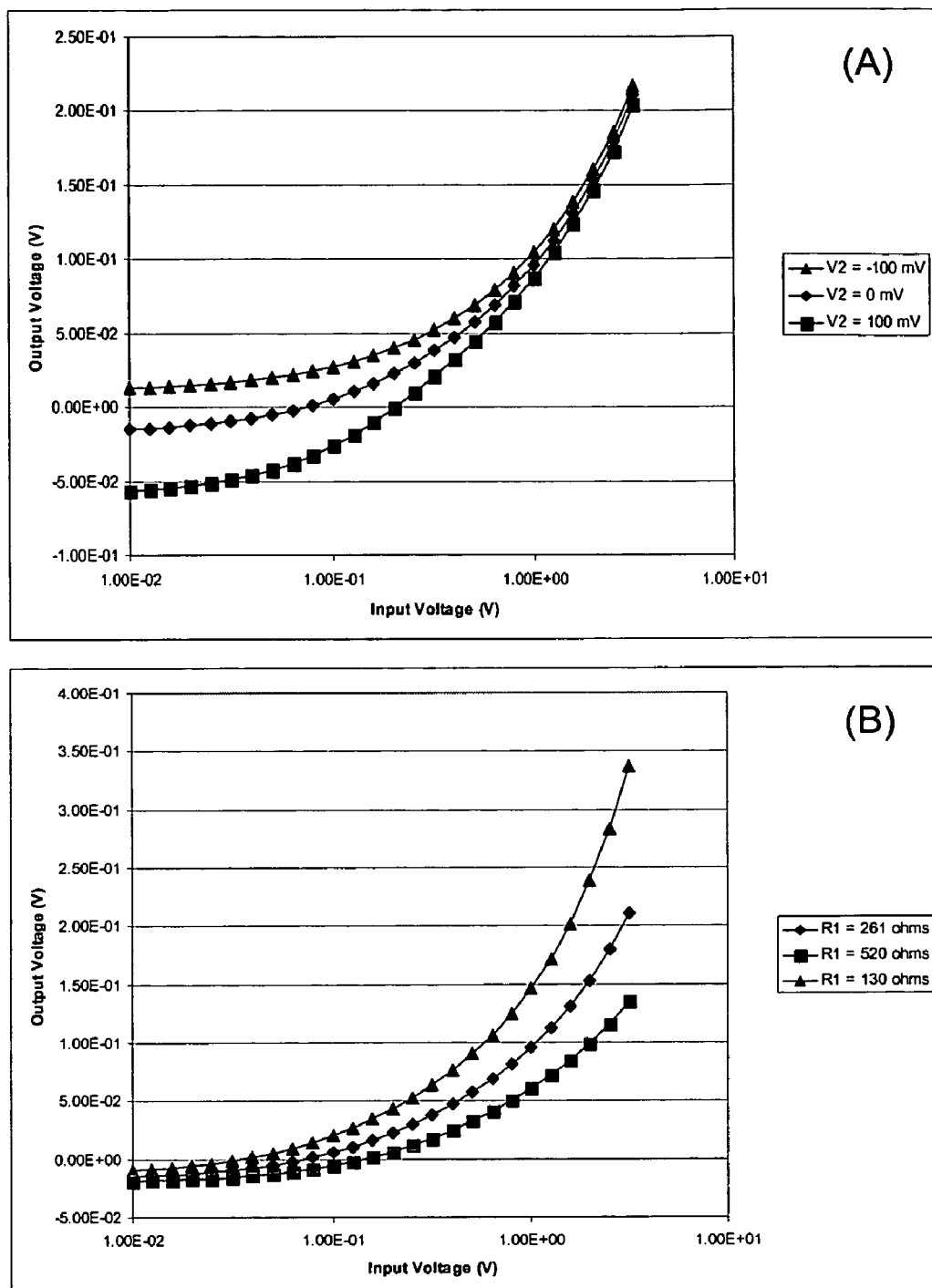

FIG. 3 shows examples of how the transfer function of the circuit shown in FIG. 2 can be shaped by changing two of the adjustable parameters, V2 and R1. FIG. 3A shows the effect of varying V2. The middle part of the transfer function is changed by changing V2. Increasing V2 decreases the curvature in the middle part of the transfer function while decreasing V2 has the opposite effect. FIG. 3B shows the effect of varying R1.

Figure 4:
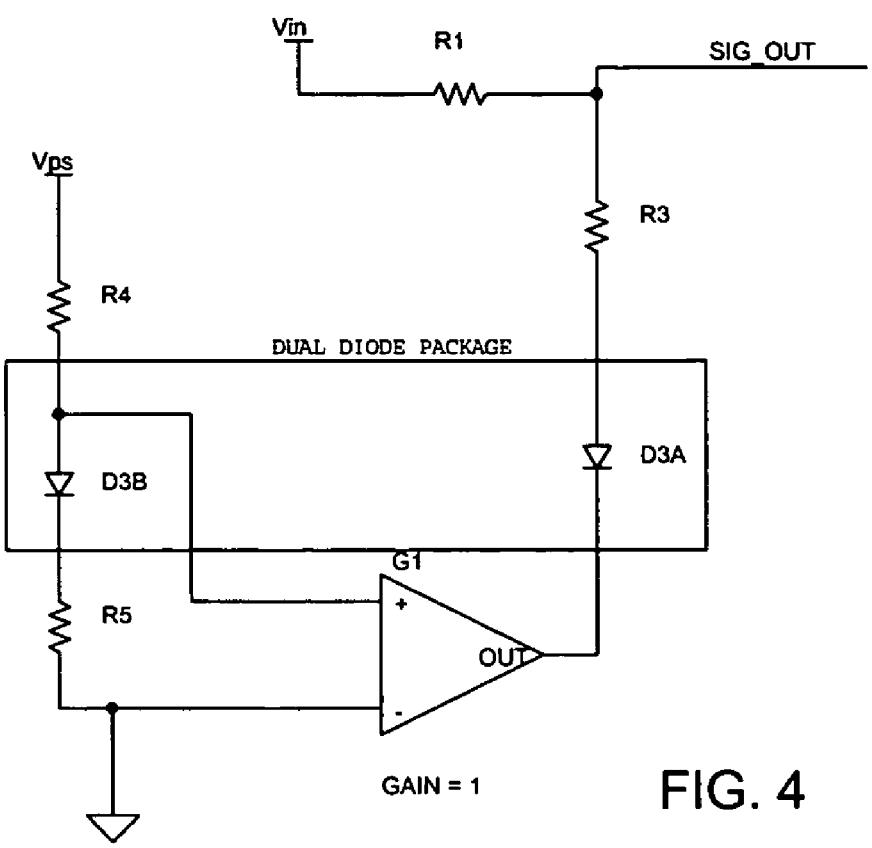

FIG. 4 shows an alternate circuit arrangement that demonstrates how a second diode can be used to control the voltage offset (V3) applied to the diode used to generate the non-linearity in order to cancel out the effects of changes in the operating temperature. To optimize the temperature compensation, the second diode may be (as shown) contained in the same package as the diode used to generate the non-linearity.

Figure 5:
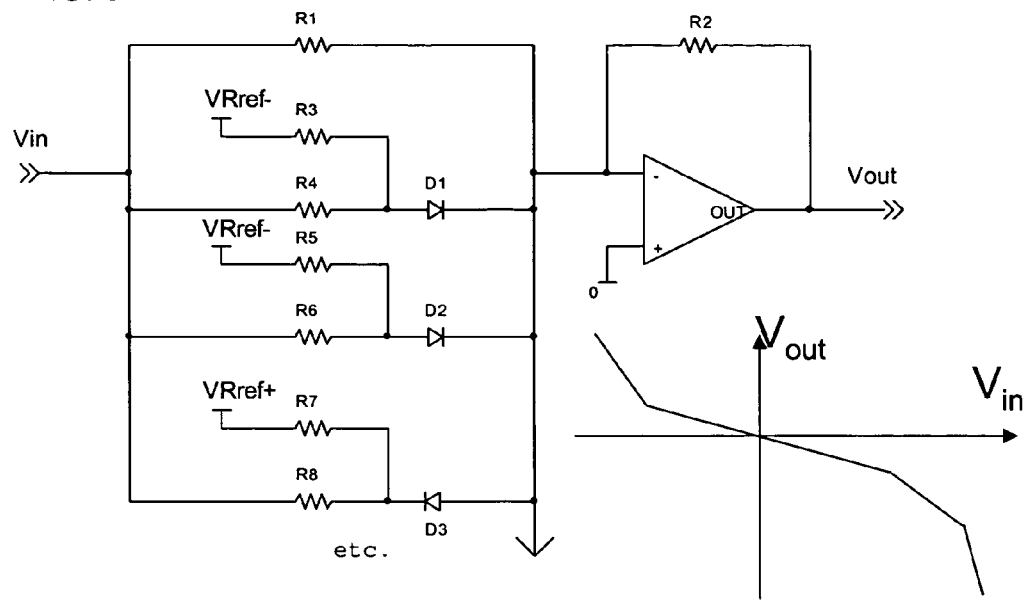

FIG. 5 shows a typical implementation of a piecewise linear transfer function. Both the circuit and the transfer function are shown. Reference: Horowitz and Hill, "The Art of Electronics", 2nd edition, p 252, Cambridge University Press.

Figure 6:
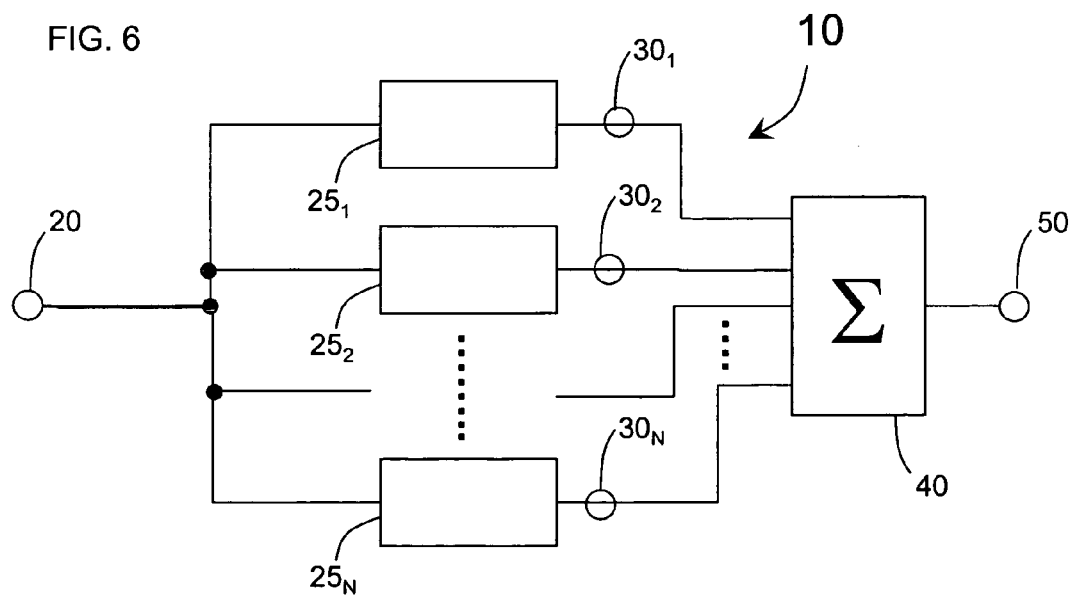

FIG. 6 illustrates a piecewise non-linear circuit arrangement architecture configured to implement a non-linear transfer function by combining the outputs of a plurality of circuits or sub-circuits according to an embodiment of the present invention.

Figure 7:
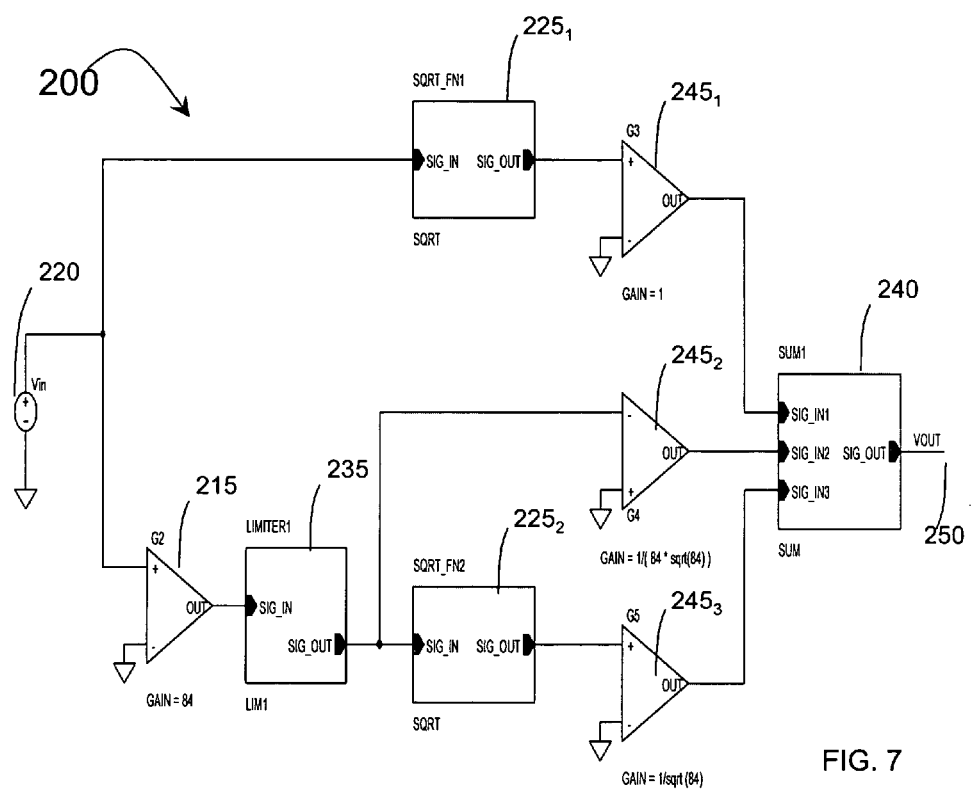

FIG. 7 is a block diagram for a piecewise non-linear implementation of a wide dynamic range square root amplifier circuit according to one embodiment.

Figure 8:
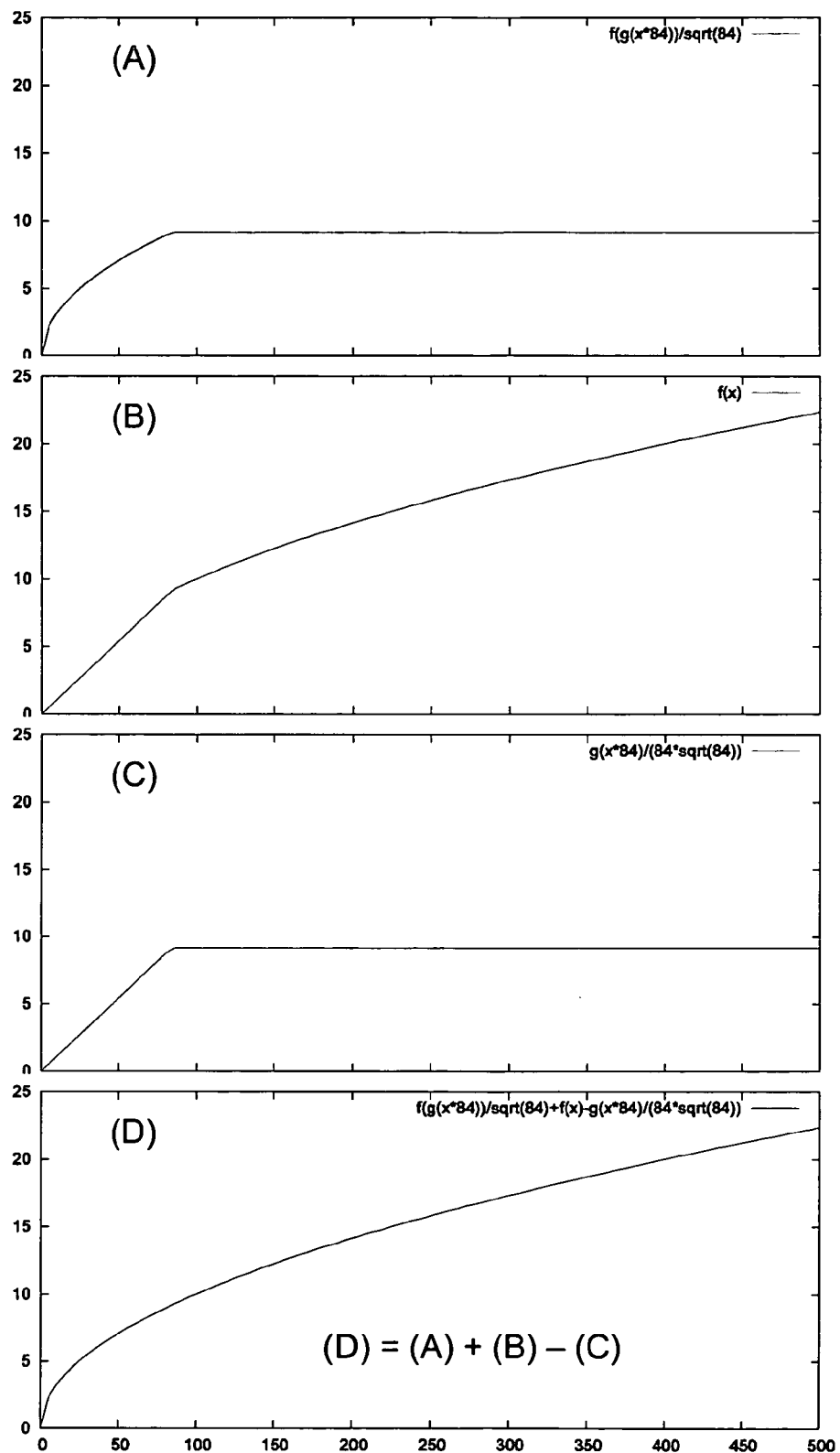

FIG. 8 shows a graphical representation of a representative set of characteristic equations for the circuit segments of FIG. 7. FIG. 8A shows the low range square root function segment. FIG. 8B shows the high range square root function segment. FIG. 8C shows the piecewise linear segment. FIG. 8D shows the sum of the outputs of the low and high range square root segments minus the piecewise linear segment; this is the full range square root function.

Figure 9:
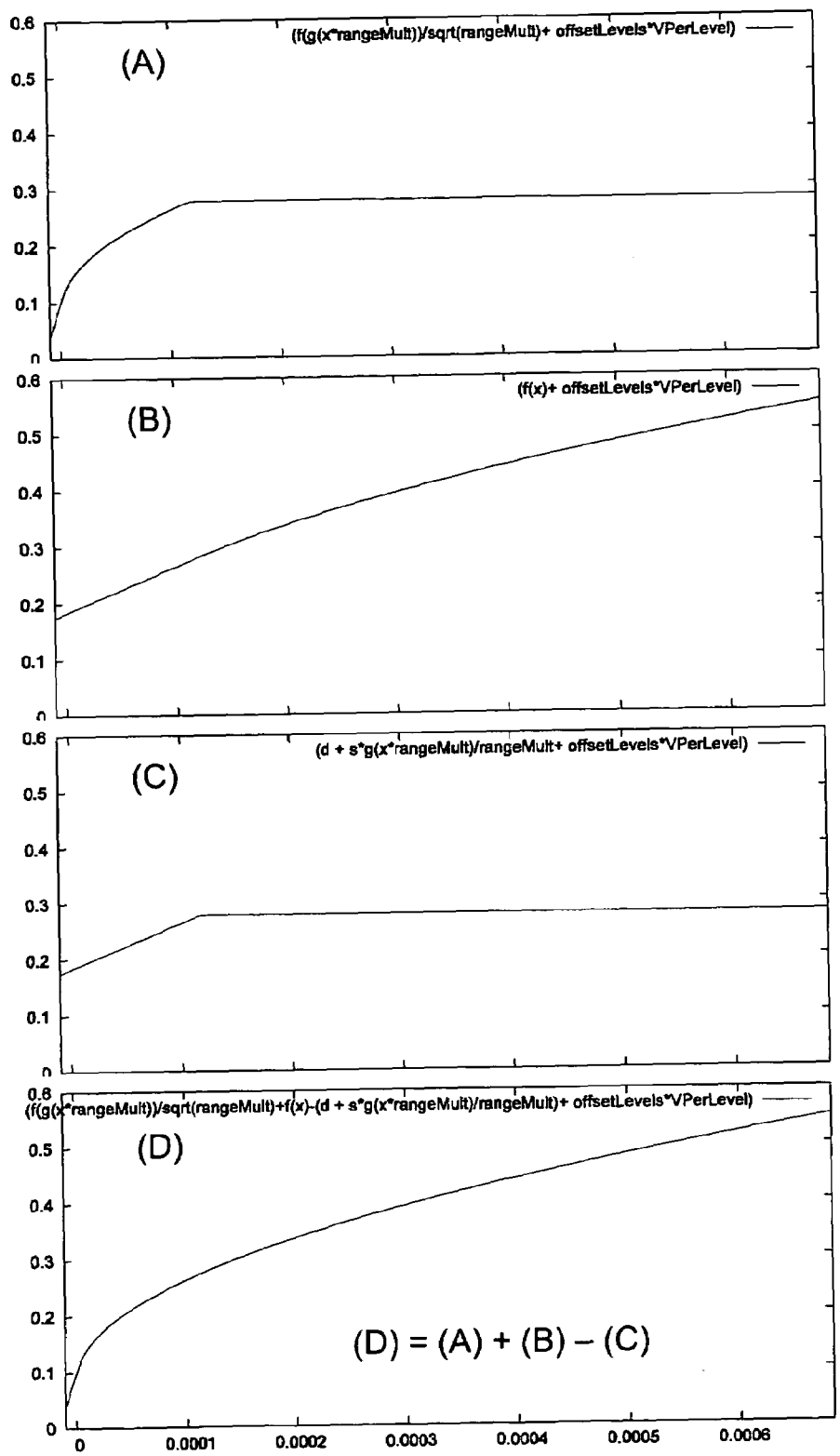

FIG. 9 shows a graphical representation of a preferred set of characteristic equations of the circuit segments of FIG. 7. These figures are similar to those of FIG. 8 except the slope is continuous at the linear-square root transition in the square root functional block. This difference is most easily seen between FIG. 8B and FIG. 9B. The horizontal scale is in amperes and the vertical scale is in volts. There is a vertical offset added to the signal to allow digitization of signals down to slightly negative currents. The digitizer used here operates from 0 to 1.6 V. The input current range for this system is from negative 15 µA to 6.8 mA.

Figure 10:
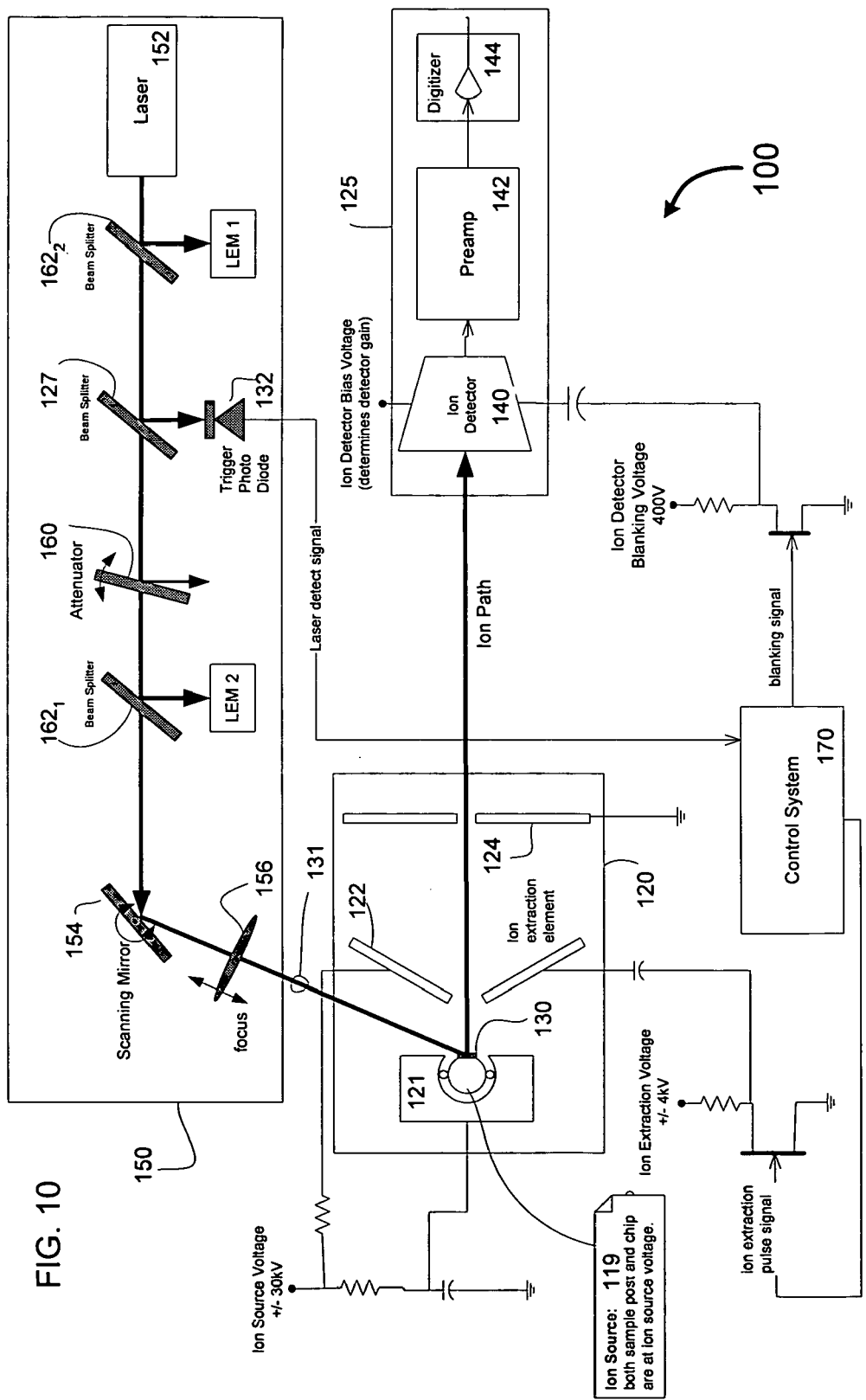

FIG. 10 illustrates a laser desorption/ionization time-of-flight mass spectrometer where the amplifier circuit arrangements of the present invention might be useful.

FIG. 11 illustrates another example of nonlinear circuit elements according to the present invention.

DETAILED DESCRIPTION OF THE INVENTION

The present invention provides circuits and circuit arrangements that implement non-linear transfer functions (or non-linear transforms). In one aspect, a high speed (high bandwidth) circuit with a non-linear transfer function over a limited range of input signal is provided. By appropriate choice of components, the non-linear transfer function can be used to accurately approximate any monotonic function (e.g., a square root transfer function is a special case). In another aspect, a circuit arrangement using a set of non-linear sub-circuits is provided to accurately generate a desired non-linear transfer function over an extended range of input signal. This type of circuit is referred to as a "piecewise non-linear circuit" because in one implementation of such a circuit, each of the sub-circuits approximates the desired non-linear function over a portion of the input range.

In one embodiment, the circuit arrangement implements a high speed square-root transform that provides a suitable noise-limited match between a signal and a linear analog-to-digital converter (ADC), where the signal includes a noise component proportional to the square root of the signal amplitude. Such noise statistics are common in any signal representing detected particles, for example, any signal representing or made up of photons (light), electrons (electrical) or ions (e.g., in a mass spectrometer device). This type of noise is called shot noise. An amplifier including such a circuit arrangement that implements a square root transform is also particularly useful in the detection system of a mass spectrometer device. Use of such an amplifier allows for an increase in the range of intensities (e.g., dynamic range) that can be recorded in a single mass spectrum transient signal. Such an amplifier is also particularly useful in a camera. In a camera, at low light levels or for short exposure times the noise of the signal for each pixel is dominated by the limited number of photons captured and as such has a noise characteristic corresponding to shot noise. In a camera, a specific example would be to use such an amplifier to apply a non-linear transform to the signal from each pixel (e.g., from a CCD array or other photon sensing device) before the signal for that pixel is digitized with an ADC.

The inputs to and outputs of the circuits used as examples here will generally be assumed to be voltage signals. As is well known in the art, similar circuits can be constructed that accept either voltage or current signals as inputs and produce voltage or current signals as outputs.

Generating Non-Linear Transfer Functions Using Diodes

Because of their intrinsically exponential current-voltage characteristic, diodes have long been used in circuits to generate logarithmic and exponential transfer functions (see, e.g., FIG. 1B). According to one aspect of the present invention, a diode inserted into a voltage divider is used to generate non-linear transfer functions other than logarithmic. A very simple example of this is shown in FIGS. 1C and 1D. FIG. 1C shows two ways of including a diode in a voltage divider to produce a non-linear and non-logarithmic transfer function. FIG. 1E shows example transfer functions for the simple voltage divider of FIG. 1A, the logarithmic diode curve of FIG. 1B, and the non-linear, non-logarithmic transfer function of the voltage divider-diode hybrid circuits of FIG. 1C. As shown in FIG. 1C the various series elements on a given branch of the circuit can be arranged in any order. FIG. 1D shows how the resistors of the previous circuit may be replaced with general impedances that can be constructed themselves of various circuit components. An example of a useful diode that can be used in circuits such as are discussed herein is an RF diode from Agilent (HMPS-2822).

Figure 1:
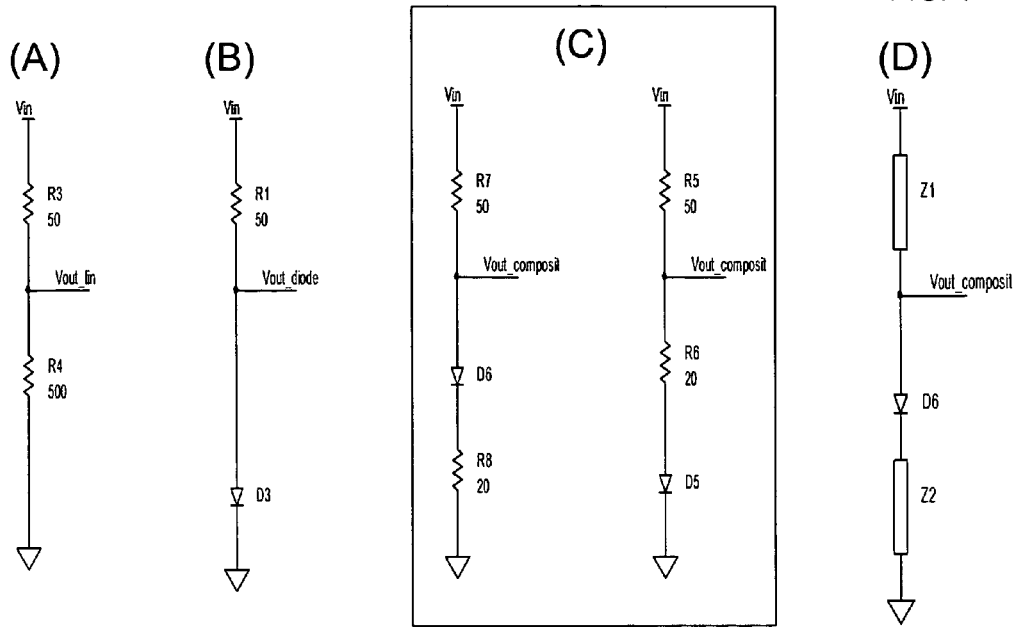
FIG. 1A shows a simple resistive voltage divider circuit.
FIG. 1B shows a simple circuit where the output is directly proportional to the I-V curve of a diode.
FIG. 1C shows two hybrid voltage divider-diode circuits. The ordering of the components on a single branch of the circuit does not affect the function of the circuit. These two circuits have identical transfer functions.
FIG. 1D shows a hybrid voltage divider-diode circuit with generalized impedance blocks instead of the simple resistors shown in FIG. 1C.
FIG. 1E shows example transfer functions for the circuits in FIGS. 1A to 1D. The transfer function of the circuit of FIG. 1A is linear. The transfer function of the circuit of FIG.
Figure 1:
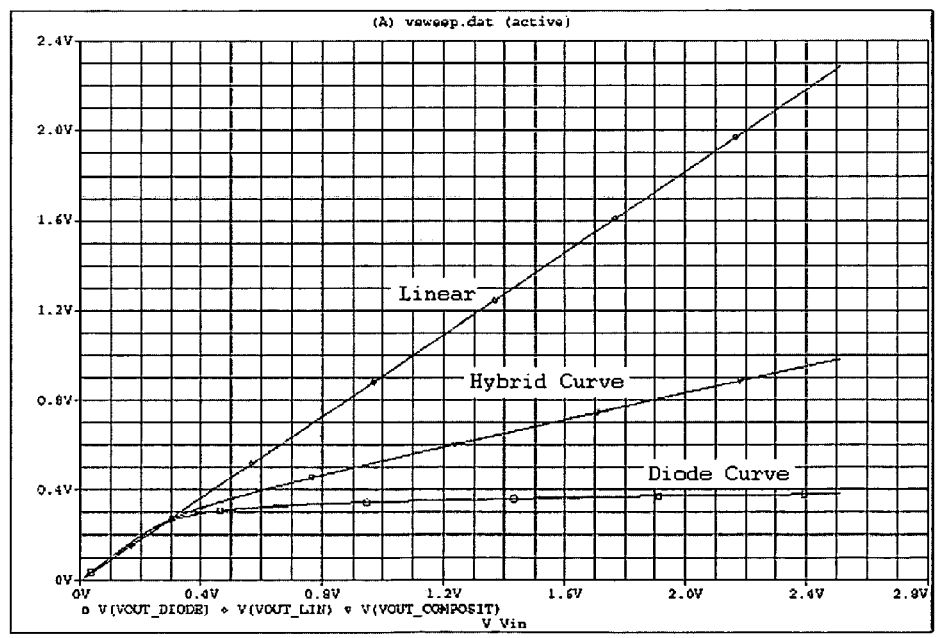

While the simple circuits shown in FIG. 1 do have non-linear, non-exponential transfer functions, they are unlikely to have the particular transfer function desired for a particular application. For example, they are unlikely to have the square root transfer function desired for optimally coupling a signal with a shot noise dominated noise characteristic to a linear ADC. By adding various voltage offsets and gain stages and by providing a bias current through the diode (D3), a transfer function may be achieved that matches the desired transfer function within allowable deviation over some range of inputs. An example of such a circuit according to one embodiment is shown in FIG. 2. In FIG. 2, the gains (G1 and G2) and the voltage offsets (V1, V2, V3, and V4) allow for matching a particular range of inputs to a particular section of the transfer function of the circuit without these adjustments. Branch 2, the branch of the circuit with V2 and R2 allows the bias current through the diode (D3) to be adjusted while maintaining flexibility in the choice of the other voltages and resistances. Note that as discussed earlier each of the resistances shown may be replaced by impedance blocks composed of one or more components. In designing this type of circuit, there will often be a trade off between the accuracy with which the realized transfer function matches the desired transfer function and the range of inputs over which the match is considered close enough. The construction of circuits that can extend the satisfactory match to cover a much larger range of inputs will be described below.

Other components may be included to increase the bandwidth of the circuit or otherwise control the frequency response. These additional components can compensate for non-ideal behavior of other components. In particular, to increase the bandwidth of this circuit to include higher frequencies, it is advantageous to have the impedance block in series with the diode contain components that cancel out the non-ideal characteristics of the diode.

A portion of the non-linear current-voltage characteristic of the diode D3 can be scaled, shifted, and shaped with the offset voltages V1, V2, V3, and V4; with resistances R1, R2, and R3; and with gain blocks G1 and G2 to generate an approximation of a desired non-linear transfer function over a particular range of input signal. Note that one skilled in the art will realize that this particular set of offset voltages, resistances, and gains provide redundant control over the scaling, shifting, and shaping of the diode characteristic. Thus, in any particular implementation of this circuit some of the offset voltages and/or resistances may be set to zero and some of the gains may be set to one. One skilled in the art will also realize that any of the resistors can be replaced with other impedance blocks constructed of zero or more components.

Examples of how the transfer function of the circuit can be shaped are shown in FIG. 3. In FIG. 3A, the middle part of the transfer function is changed by changing V2. Increasing V2 decreases the curvature in the middle part of the transfer function while decreasing V2 has the opposite effect. FIG. 3B demonstrates how R1 affects the transfer function. When the curves are scaled and offset so that the end points match, it can be seen that the resulting changes in shape are primarily in the low signal part of the transfer function.

According to one aspect, a procedure for determining the offset voltages, resistances (impedances), and gains is as follows:

(1) Accurately model the circuit.
(2) Apply a test signal to the input of the model over the desired input range.
(3) Adjust the offset voltages, resistances, and gains to minimize the difference between the modeled output signal and the desired output signal. Note that because of the redundancy in the parameter set of voltages, resistances, and gains some of the parameters may need to be constrained for the minimization procedure to succeed. For example, at least one of the voltages, V1, V2, V3, V4, must be constrained because only voltage differences affect the operation of the circuit.
(4) Adjust the frequency characteristics of the circuit by adding other components or replacing the resistors with other impedances.

Stability of both offsets and gains are critical for a non-linear amplifier because, unlike for linear amplifiers, a change in the offset of an input signal will change the gain applied to each particular value of the input signal. That is, the slope and offset of the transfer function are coupled together. In particular, temperature compensation will often be necessary for high precision or high dynamic range applications.

Temperature compensation can be achieved, in one aspect, by controlling V3 so that V3 plus the voltage across the diode D3 as a function of current or—for first order temperature compensation—at a particular current is not a function of temperature. This is achieved in one aspect by using a second diode element (D3B) with a bias current through it to control V3 as shown in FIG. 4.

This implementation of a non-linear transfer function over a limited range of input is able to operate at very high speeds (high bandwidth) because of the particularly clean architecture, because of the use of diodes to generate the non-linearity that is shaped by the other components, and generally because the system does not depend on feedback to form the transfer function. While feedback elements may be used (in particular in the gain blocks) and while this architecture may be used in a circuit with feedback or as part of the feedback loop itself, such implementations will often limit the usable bandwidth. This is true because diodes of very high speed are available. Note that this circuit architecture and the circuit architecture described below can both be realized, potentially to great advantage, within ASICs (application specific integrated circuits), as a integrated amplifier, or as a functional block within a larger integrated circuit (for example an integrated digitization system).

Piecewise Non-Linear

A standard technique for generating an electronic circuit with an arbitrary monotonic transfer function is to approximate the transfer function with multiple linear segments. See FIG. 5 (see, e.g., Horowitz and Hill, "The Art of Electronics", 2nd edition, p 252, Cambridge University Press). Diodes in conjunction with voltage references are used to switch the slope of the transfer function as a function of the input signal level. The technique described here is similar in that the input signal range may be divided up into sections that are each handled differently by the circuit. In one example, a non-linear transfer function is applied to at least one of the input ranges, and different paths through the circuit are utilized to handle different input signal ranges. By applying different non-linear transfer functions to various input signal ranges an accurate non-linear transfer function for the composite circuit can be realized over very large dynamic ranges or for complicated functionalities. This circuit architecture is termed "piecewise non-linear". In another example, this concept may be generalized by allowing the various input signal ranges to overlap or coincide with each other. Even though the input signal is no longer divided up into distinct ranges, this is referred to as a "piecewise non-linear" circuit because the circuit architecture is the same. In both examples, it is important to realize that multiple paths through the circuit may be active for all input signals within the intended input signal range.

FIG. 6 illustrates a general architecture of a piecewise non-linear circuit arrangement 10 according to an embodiment of the present invention. As shown, circuit arrangement 10 includes a plurality of circuit segments, or sub-circuits 25. The input signal 20 is split and allowed to pass into two or more sub-circuits 25. The transfer function of at least one of the sub-circuits 25 is non-linear. The outputs 30 of the sub-circuits 25 are combined in a summing section 40 to generate the single output 50 of the composite circuit arrangement 10.

Often, each sub-circuit 25 may have a transfer function that can be thought of as the sum of two parts. The first part is the non-linear transfer function desired at the output multiplied by some scale factor over a limited input signal range. The second part is some easily removable function of the input signal over the entire input signal range. This allows the second part of the transfer function to be subtracted out by providing a sub-circuit that provides an inverted version of the function to be removed to the summing section of the circuit. Often the second part of the transfer function will be a constant, linear, or piecewise linear function of the input established by 1) simply limiting the range of the input signal that passed through the sub-circuit or 2) by constructing the non-linear section so that its output becomes linear for signals outside the limited range for input handled by the particular sub-circuit.

In one aspect, at least one sub-circuit 25 has a transfer function that cancels out the second parts of the transfer functions of the other sub-circuits. When the second parts of the other sub-circuits are limited to constant, linear, or piecewise linear forms, then the canceling transfer function can be linear or piecewise linear.

In one aspect, as shown, the outputs of all of the sub-circuits 25 are summed together to generate the output 50 of the composite circuit. The summation circuit 40 may weight and/or invert the outputs of the different sub-circuits 25 as they are included in the sum.

A preferred embodiment of this circuit typically includes two or more non-linear sub-circuits 25, each applying the desired transfer function to a particular range of the input signal 20. Outside of the particular range, the input to each sub-circuit is limited so that the output of the particular sub-circuit is a constant. In one aspect, a sub-circuit 25 with a linear or piecewise linear transfer function designed to cancel out the output of the other sub-circuits outside of their particular input ranges is included.

The piecewise non-linear circuit architecture of the present invention is especially useful for circuit realization of transfer functions equivalent to self similar functions and other functions that look the same on different scales or on different input ranges. Examples include the exponential, logarithm, power law, and root (e.g., square root) functions. For these functions, a single sub-circuit with limited dynamic range can be used together with scaling and offsets to construct a circuit with any desired dynamic range. That this is possible can be seen in the following expansions of some simple functions:

a) $y(ax)=sqrt(ax)=sqrt(a)*sqrt(x)=sqrt(a)*y(x)$, where $sqrt(x)$ means the square root of x.
b) $y(ax)=log(ax)=log(a)+log(x)=log(a)+y(x)$
c) $y(a+x)=e^{(a+x)}=e^a*e^x=e^a*y(x)$ As a specific example, the block diagram for a 300 MHz wide dynamic range square root amplifier circuit 200 according to one embodiment is shown in FIG. 7. This example circuit realizes a square root transfer function with a dynamic range of 7056 (equal to $84^2$) built out of square root functional blocks each with a dynamic range of 84 by implementing the following functional equations.

a) square root functional block 225: $sr(x)=x/sqrt(84)$ if x<84 and $sr(x)=sqrt(x)$ if x>=84. Note the change from square root to linear behavior at lower signal levels. Note that the functional dynamic range of this block is assumed to be 84 or better. Note that a preferred implementation of a square root functional block will not have the discontinuous slope of the transfer function between the square root and linear sections used in this example.
b) limiter functional block 235: $lim(x)=x$ if x<7056 and $lim(x)=7056$ if x>=7056.
c) The composite circuit 200 as shown has three paths from the input 220 to the output 250 (examples of transfer functions for each of the paths is shown in FIG. 8. In FIG. 9, a similar set of transfer functions is shown for a preferred implementation where the slope is continuous at the linear-square root transition of the square root functional block.):
  (1) high signal square root path through sub-circuit $225_1$ and gain module $245_1$: $high(x)=sr(x)$ (FIG. 8B)
  (2) low signal square root path through gain module 215, limiter 235, sub-circuit $225_2$ and gain module $245_3$: $low(x)=sr(lim(x*84))/sqrt(84)$. (FIG. 8A) The input signal is amplified by a factor of 84 and limited to less than or equal to 7056 before being fed into a square root block identical to that used for the high signal path. After the square root is taken, the signal is rescaled in gain module $245_3$ before being added to the signal from the other paths in block 240.
  (3) linear path through gain module 215, limiter 235 and gain module $245_2$: $linear(x)=-lim(x*84)/(84*sqrt(84))$. (FIG. 8C) As can be seen in FIG. 7, the amplified and limited signal from the low signal square root path is simply inverted and scaled before being added to the signal from the other paths in block 240.
d) Summing section 240. The summing section of the circuit simply adds the three paths together giving the overall functional equation: $output(x)=sr(lim(x*84))/sqrt(84)+sr(x)-lim(x*84)/(84)$. (FIG. 8D)
e) The output 250 of the circuit is equal to the square root of the input over inputs ranging from 1 to 7000. For inputs below 1, the output is a linear function of the input. This linear limiting behavior at very low signal amplitudes is generally preferred in an actual implementation to avoid over amplifying low level noise and to keep the circuit well behaved when the input signal swings from positive to negative. In this way, a square root transform is applied to positive signals while a linear transform is applied to negative signals and very small positive signals.

The piecewise non-linear architecture can be used to realize accurate non-linear transfer functions with both a large dynamic range and high speed (e.g., a square root transfer function with a dynamic range of over 3000 and a bandwidth of over 300 MHz). Achieving both a large dynamic range and high speed is difficult with other methods of generating non-linear transfer functions. With piecewise linear circuits, for example as described and shown in FIG. 5, it is hard to accurately generate non-linear transfer functions for signals with a large dynamic range. Accurately generating most non-linear transfer functions, including the square root function, over a large range of signal levels (large dynamic range) with a piecewise linear architecture requires the use of many linear segments. With the traditional diode-switched piecewise-linear circuit architecture the number of segments that can be effectively utilized is limited by the available voltage and by the voltage swing required to switch a diode. At high speeds, this limit becomes especially severe as the available voltage range becomes limited by the slew rate of signal amplifiers. While there are methods of using diodes and amplifiers in feedback configurations to decrease the voltage swing required to switch from one linear segment to another, these methods are hard to implement at high speeds. Another method used to generate a square root transfer function (See, Mark Shill, "Circuit takes square root of input voltage", EDN Access, EDN Magazine, 1997) utilizes an NMOS transistor operating in the saturation region where the drain current is proportional to the square of the gate-source voltage. While simple, the speed achievable with this architecture is limited by the large gate capacitance of MOSFET transistors to substantially less than 100 MHz.

Calibration

The advantages of a non-linear amplifier for efficient digitization are realized if the transfer function is similar to, i.e., substantially the same as, the ideal transfer function. In other words, the exact ideal transfer function is generally not required. Although the exact ideal transfer function is generally not required, the non-linearity must generally be reversible. This can be accomplished in two ways. Either the transfer function must be known to sufficient accuracy for the particular application or the actual transfer function of the realized circuit must be measured.

Calibration is the measurement of the realized transfer function. This can be achieved by supplying a known input to the non-linear system and measuring the output. For example, the transfer function of the non-linear system can be deduced by measuring the output of the non-linear system when a sinusoidal signal of known amplitude is applied to the input and when a constant signal (for example a ground or null signal) of known value is applied to the input. The frequency and phase of the sinusoidal input signal can be determined from the periodic nature of the output, while the amplitude offset of the sinusoidal input can be determined by comparing the output to the output generated with the known constant input. With a second but different constant input signal the amplitude of the sinusoid can also be determined. In a preferred implementation, these measurements will occur in situ (with the amplifier in the operating instrument), periodically, and utilizing the digitization system that is used during data collection. A somewhat extreme example would be to automatically perform the calibration before every measurement period.

As indicated above, any signal fundamentally consisting of distinct particles (e.g., light, current, ions, atoms, molecules) contains shot noise. When this shot noise dominates the noise characteristic of the signal, taking the square root of the signal will decrease the variation in the amplitude of the noise with the amplitude of the signal. This allows the dynamic range of a linear ADC to be efficiently utilized. The circuits and methods described here allow the construction of high bandwidth square root amplifiers. Such amplifiers are useful in many areas including mass spectrometry, photography and other light detection based technologies, and, generally, high bandwidth recording of any electronic signal.

Square Root Amplifier in a Mass Spectrometer

Because mass spectrometers are usually capable of detecting individual or small numbers of particles, it is common for the noise characteristic of the output signal to be dominated by the shot noise associated with the detected particles. Because the noise characteristic in a mass spectrometer is shot noise dominated, the dynamic range over which noise limited resolution can be achieved can be dramatically increased by effectively taking the square root of the signal before digitizing the signal with a linear ADC.

In a mass spectrometer, in particular for a laser desorption/ionization mass spectrometer, multiple spectra are usually acquired and then summed or averaged to generate a composite spectrum with improved signal-to-noise characteristics. Before this averaging occurs, the non-linearity introduced by effectively taking the square root of the signal must generally be accurately removed. This is required because the individual spectra summed or averaged are in general not identical and mathematically: $f(a)+f(b)$ is not generally proportional to $f(a+b)$ for a non-linear function $f(x)$ where a and b are the spectra to be summed and $f(x)$ is the non-linear function that has been applied to the signal. Calibration of non-linear electronics in a mass spectrometer serves several important purposes. For example, calibration allows for a) the accurate removal of the introduced non-linearities, b) the removal of any residual drift of the transfer function over time, and c) more accurate matching of distinct instruments.

FIG. 10 illustrates a schematic view of components of a laser desorption/ionization time-of-flight mass spectrometer device 100 where circuit embodiments of the present invention might be useful. Briefly, mass spectrometer device 100 includes ion optics system 120, ion detection system 125, light optics system 150 and control system 170. In particular, non-linear transform amplification circuits of the present invention, such as circuit 10 or circuit 200, are useful in detection system 125 as will be discussed below.

As shown, ion optics system 120 includes a repeller lens 121, an extractor plate 122 and an acceleration lens or ground plate 124. An optional mass filter (not shown) may be included, and would typically be positioned between lens 124 and detector 140. As shown, extractor 122 is conical in shape and acceleration lens 124 is planar, however, other geometries may be used as desired. For example, both extractor 122 and acceleration lens 124 may be planar. Both extractor 122 and acceleration lens 124 have apertures which together define a flight path for ions desorbed from sample 130. A flight tube (not shown) or other enclosure encloses the flight path between the ion optics system 120 and the detection system 125. Typically this enclosure is evacuated so as to prevent unwanted interactions during ion flight.

Mass spectrometer device 100 also includes a light optics system 150 that includes a light source 152. Light optics system 150 is designed to produce and deliver light to the sample 130. In preferred aspects, optics system 150 includes a plurality of optical elements that may condition, redirect and focus the light as desired so that a light pulse of known energy, and focus, is delivered to the sample 130. Light source 152 preferably includes a laser, however, other light producing elements may be used as would be apparent to one skilled in the art. The delivered light is preferably provided as one or more pulses of known duration and intensity. Thus, in preferred aspects, light system 150 generates and delivers a pulsed laser beam to sample 130. The laser source may include a pulsed laser or a continuous (cw) laser with pulse generating elements.

Additional aspects and details of the elements of light system 150, as well as ion optics system 120 and control system 170, may be found in co-pending U.S. Non-provisional patent application Ser. No. 10/832,822 entitled "Laser Desorption Mass Spectrometer with Uniform Illumination of the Sample", filed on Apr. 26, 2004, which is incorporated by reference.

Detection system 125 includes an ion detector 140, a pre-amplifier module 142 and a digitizer module 144. Ion detector 140 includes circuit elements for detecting ions desorbed from sample 130 and converting the detected ions to a signal (transient signal) representing the detected ion spectrum. Suitable detection elements include electron multiplier devices and other charge-based detectors. Examples include discrete and continuous dynode electron multipliers. Digitizer 144 converts the analog spectra signals to a digital form, e.g., using an analog-to-digital converter (ADC). Pre-amplifier 142 is included for conditioning transient signals from ion detector 140, for example by applying a non-linear (e.g., square root) transform to the transient signals, prior to digitization. The ion to electron conversion efficiency of detection system 125 is generally a function of the electronic properties of the surface of the detector's ion-to-electron conversion dynode, the gain of the ion detector 140, and the gain of its associated electronics, including preamp 142 when used.

In one aspect, it is generally desirable to sample a transient signal at intervals of 2.0 ns or less. In this case, digitizer 144 should operate with a sampling rate of greater than about 500 Ms/sec. Also, use of an amplifier having a bandwidth of greater than about 250 MHz is desirable. The signal amplitude in a mass spectrometer transient signal can vary over a range of greater than 1000:1, i. e., a dynamic range of greater than 1000. It is traditionally difficult to achieve both a high sampling rate and a large dynamic range as is required for the digitization of such signals. Therefore, in one embodiment, pre-amplifier includes a circuit 10 or circuit 200, configured to apply a square root transform. Because the input transient signal has a noise component proportional to the square root of the amplitude, the transient signal output by pre-amplifier 142 will therefore advantageously have a noise component that is substantially independent of signal amplitude. In this manner, the effective number of bits in linear ADC 144 may increased, e.g., theoretically doubled from 7 to 14, but in application the increase will often be less than this because of the desirable linear response for small and negative signals.

FIG. 11 illustrates another example of nonlinear circuit elements according to the present invention. FIG. 11a shows an example of a circuit with a diode in series with impedance similar to the circuits of FIG. 1. FIG. 11b shows a useful modification to the circuit of FIG. 11a. Using additional circuitry, it is possible to make the response of the non-linear building block linear or constant outside of a particular range. As shown in FIG. 11b, the addition of R3 makes the low signal response linear. One skilled in the art will appreciate that similar circuitry can be used to make the high and/or low circuit response linear.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. For example, although specific examples were discussed, the amplifier circuits of the present invention operate with signals from 0 Hz to over 5 or 6 GHz. Therefore, the scope of the appended claims should be accorded the broadest interpretation so as to encompass all such modifications and similar arrangements. All documents referred to herein are incorporated by reference. Additionally, this application incorporates by reference U.S. Provisional application Ser. No. 60/585,350 titled "NON-LINEAR SIGNAL AMPLIFIERS AND USES THEREOF IN A MASS SPECTROMETER DEVICE", filed Jul. 1, 2004, which is incorporated herein by reference. Where "knee" is referred to in that provisional application, "knee" relates to a pertinent portion of the diode circuit response curve that may be shaped and used as discussed herein.

What is claimed is:

1. A mass spectrometer device, comprising:
    a particle source that provides particles;
    a detector that detects the particles and provides a signal having an amplitude proportional to a detected particle flux;
    a signal amplifier having a substantially non-linear transfer function that produces an amplified signal having a noise component that is substantially independent of the signal amplitude; and
    an analog to digital converter (ADC) that converts the amplified signal to a digital output signal.

2. The device of claim 1, wherein the particle source is an ion source.

3. The device of claim 2, wherein the detector comprises an ion detector configured to detect ions desorbed from the ion source.

4. The device of claim 3, wherein the ion detector comprises one of a channel electron multiplier, electron multiplier and a multi-channel plate.

5. The device of claim 1, wherein the non-linear transfer function is substantially a square root function.

6. The device of claim 1, wherein the non-linear transfer function is non-logarithmic and non-exponential.

7. The device of claim 1, wherein the ADC samples the amplified signal at a rate greater than about 500 Ms/sec, and wherein the signal amplifier has a bandwidth of greater than about 250 MHz.

8. The device of claim 1, wherein the ADC has a sampling interval of less than about 5 ns and wherein the operational bandwidth of the non-linear amplifier is greater than about 100 MHz.

9. The device of claim 1, wherein the signal amplifier includes:
    two or more circuit elements, each circuit element configured to receive at least a portion of the signal and to produce a circuit element output, wherein at least one of said circuit elements has a non-linear transfer function; and
    a combining circuit that combines the circuit element outputs to generate the amplified signal.

10. The device of claim 1, wherein the non-linear transfer function of the signal amplifier is generated at least in part by a diode in series with an impedance element.

11. A method of amplifying a mass spectra signal in a mass spectrometer, the method comprising:
    receiving a transient signal from a signal source, the transient signal having an amplitude proportional to a detected particle flux; and
    amplifying the transient signal in a non-linear amplifier having a non-linear transfer function that approximates a square root transfer function to produce an amplified signal having a noise component that is substantially independent of the signal amplitude.

12. The method of claim 11, further comprising converting the amplified signal to a digital output signal using a substantially linear analog-to-digital converter (ADC).

13. The method of claim 11, wherein a sampling interval of the ADC is less than 5.0 ns and wherein the operational bandwidth of the non-linear amplifier is greater than about 100 MHz.

14. The method of claim 11, comprising amplifying the signal to decrease the variation in the amplitude of the noise component of the signal as a function of the amplitude of the signal.

15. The method of claim 11, wherein the non-linear transfer function of the non-linear amplifier is generated at least in part by diode in series with an impedance element.

16. The method of claim 11, wherein the non-linear amplifier includes:
   two or more circuit elements, each circuit element configured to receive at least a portion of the transient signal and to produce a circuit element output, wherein at least one of said circuit elements has a non-linear transfer function; and
   a combining circuit that combines the circuit element outputs to generate the amplified signal.

* * * * *